United States Patent [19]

Muramoto et al.

[11] 3,950,200

[45] Apr. 13, 1976

[54] METHOD OF FABRICATING THERMAL PRINTING HEAD

[75] Inventors: Shoichi Muramoto; Ichiro Fukunaga, both of Tokyo; Haruyuki Ikeda, Nagoya, all of Japan

[73] Assignee: Nippon Toki Kabushiki Kaisha, Japan

[22] Filed: Dec. 10, 1973

[21] Appl. No.: 423,451

[30] Foreign Application Priority Data
May 2, 1973 Japan................................ 48-48482

[52] U.S. Cl. ..................... 156/89; 101/31; 156/155; 156/235; 156/240; 156/277; 219/216; 346/139 C; 427/96; 427/123; 427/125; 427/149; 427/152; 428/901
[51] Int. Cl.² ................... B32B 31/26; C03C 17/22; G01D 15/20; H05B 3/16
[58] Field of Search ........... 156/235, 240, 155, 277, 156/89; 117/3.3–3.6; 161/DIG. 7; 101/31; 346/74 R, 76 R, 139 C; 219/216; 427/96, 123, 125, 149, 152; 428/427, 428, 432, 901

[56] References Cited
UNITED STATES PATENTS

| | | | |
|---|---|---|---|
| 2,351,933 | 6/1944 | Decker et al. ................... | 156/235 X |
| 2,512,929 | 6/1950 | Galbraith et al. ................ | 156/155 X |
| 2,629,670 | 2/1953 | Rathke ............................ | 156/155 X |
| 3,240,642 | 3/1966 | Gaudio ........................... | 156/240 X |
| 3,279,969 | 10/1966 | Borchardt .......................... | 156/235 |
| 3,574,029 | 4/1971 | Ettre .............................. | 156/235 X |
| 3,615,980 | 10/1971 | Schuck et al. .................. | 156/240 X |
| 3,655,496 | 4/1972 | Ettre et al. ..................... | 156/155 X |

*Primary Examiner*—William A. Powell
*Assistant Examiner*—Thomas Bokan
*Attorney, Agent, or Firm*—Flehr, Hohbach, Test

[57] ABSTRACT

A method of fabricating a thermal printing head by printing a circuit pattern of resistive elements and electric conductors on one surface of a flat paper sheet, covering the circuit pattern and surface of the flat paper sheet with a carrier layer of a substantially transparent methacrylic acid resin, peeling off the flat paper sheet, placing the remaining carrier layer carrying the circuit pattern over a surface of a pre-shaped insulating substrate with the circuit pattern being laid downward, and heating the carrier layer placed on the substrate to cause the carrier layer to be burned off and cause the circuit pattern to adhere to the surface of the substrate.

8 Claims, 15 Drawing Figures

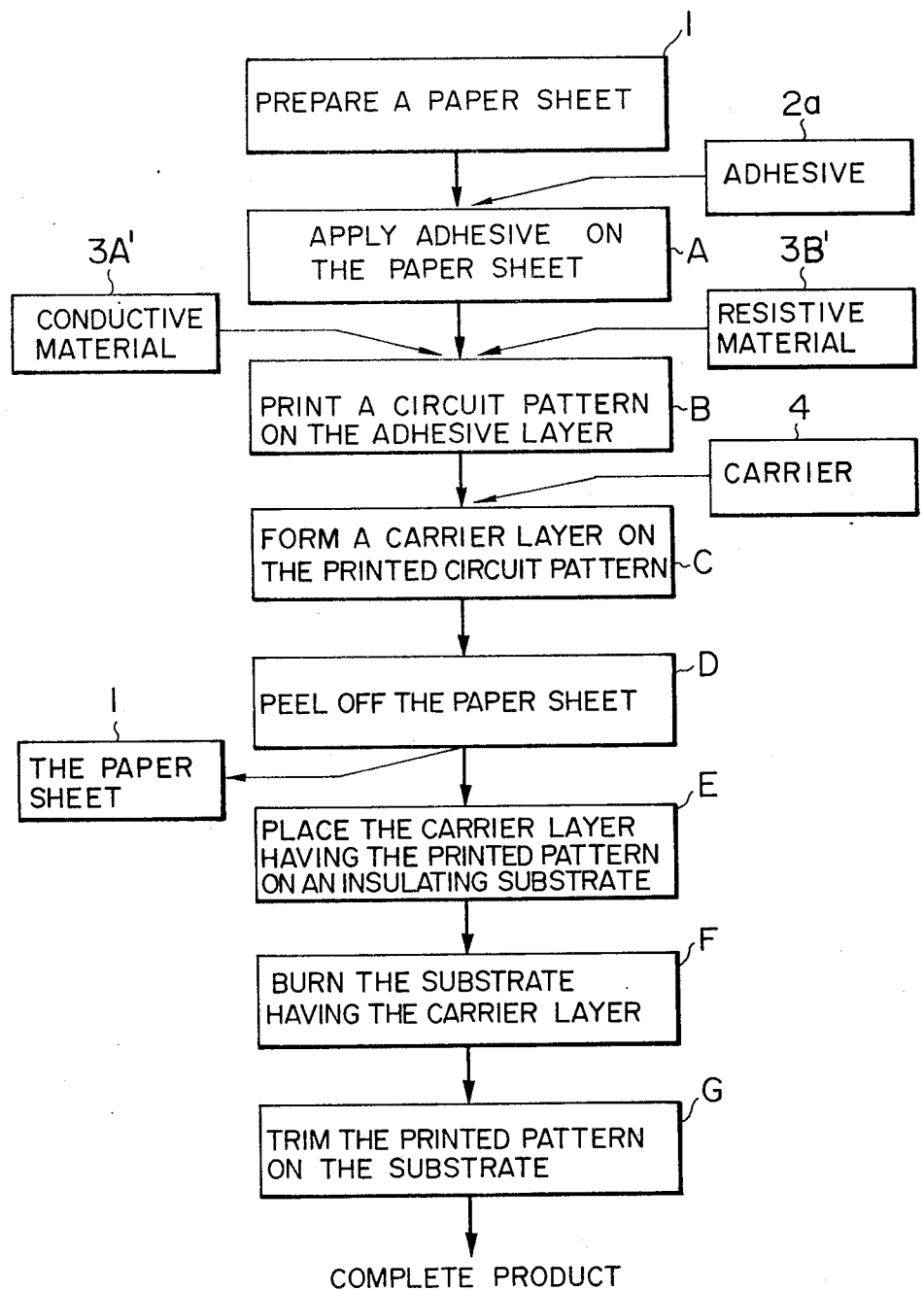

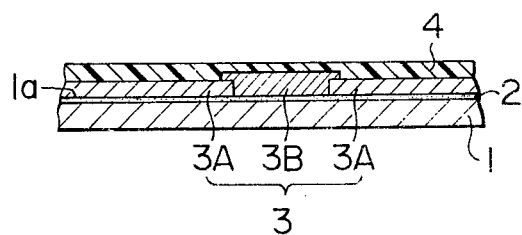
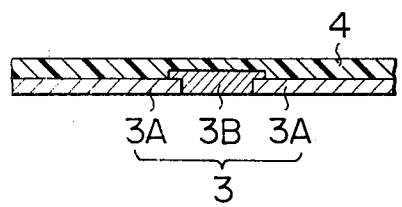
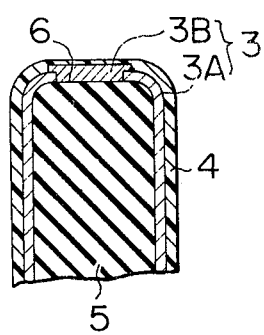
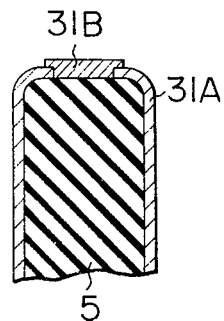
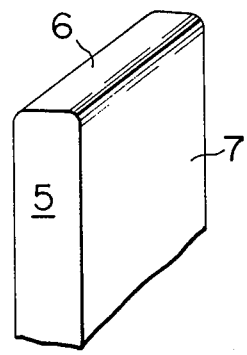
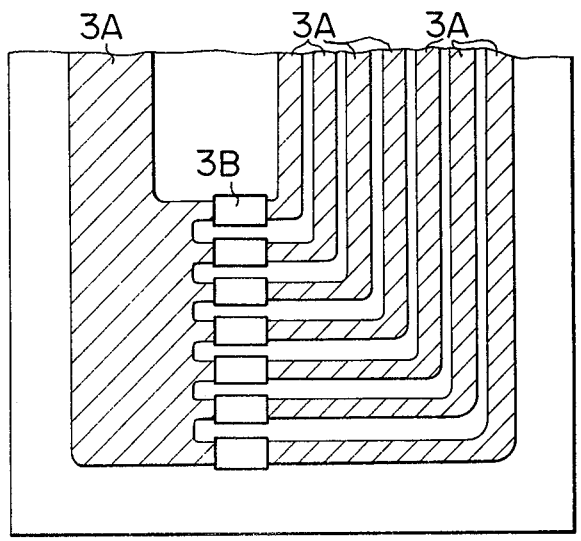

FIG. 9
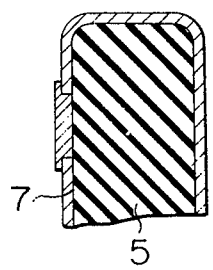
FIG. 10
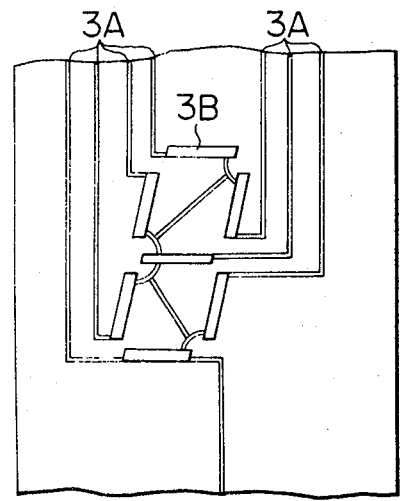
FIG. 8
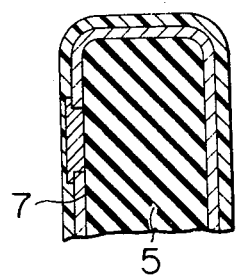
FIG. 11A    FIG. 12A
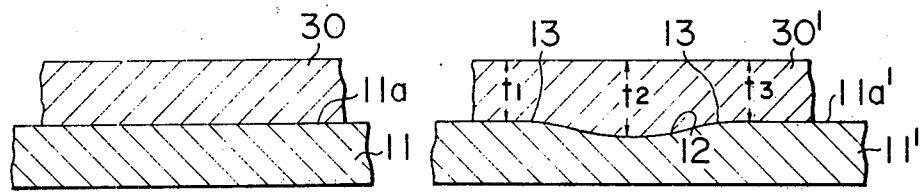
FIG. 11B    FIG. 12B
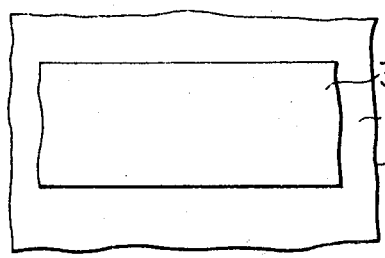
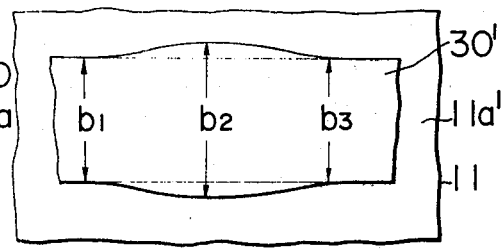

METHOD OF FABRICATING THERMAL PRINTING HEAD

BACKGROUND OF THE INVENTION

1. Field of the Invention

This invention relates to a method of fabricating a printing head for use in a thermal printing system for thermally recording on thermally sensitive recording materials.

2. Description of the Prior Art

In a well-known thermal printing system, an information being printed can be printed on a thermally sensitive recording material by converting an electric current representative of the information into a signal in the form of thermal energy and applying the signal to the thermally sensitive recording material by means of a printing head associated with the material. There is well known such a printing head comprising a substrate made of a material having a high resistivity, a plurality of resistive elements selectively arranged on said substrate for converting an electric signal into a signal in the form of thermal energy, and electric conducters arranged on the substrate and connected with the resistive elements for feeding the electric signal thereto. In conventional methods of fabricating such a printing head, with the substrate being made of an insulating material such as glass, resistive elements and electric conductors are provided on the substrate by use of vacuum evaporation or sputtering or circuit printing process, or with the substrate being made of semiconductor material, resistive elements and electric conductors are provided on the substrate by use of diffusion process.

Since the physical dimensions of such a printing head require that the resistive elements are formed to have minute dimensions such as in the order of less than 0.5 mm, however, the conventional methods as mentioned above have the disadvantages that fabricating yield is poor and complicated processes are involved and that the resultant resistive elements are incomplete in different points such as accuracy, adhesive property to the substrate, unchangeability of resistance and wearproof, which is dependent on the thickness of the elements.

SUMMARY OF THE INVENTION

An object of this invention is to provide an improved method of fabricating a printing head eliminating the disadvantages as mentioned above wherein resistive elements and electric conductors, the more important parts of printing head, can be efficiently arranged on a substrate and the resultant printing head can have an excellent performance.

According to this invention, there is provided a method of fabricating a thermal printing head comprising the steps of printing a circuit pattern of resistive elements and electric conductors on one surface of a flat paper sheet, covering said circuit pattern and said one surface of the flat paper sheet with a carrier layer of a substantially transparent methacrylic acid resin, peeling off the flat paper sheet, placing the remaining carrier layer carrying said circuit pattern over a surface of a pre-shaped insulating substrate with said circuit pattern being laid downward, and hereafter heating the carrier layer placed on the substrate to cause the carrier layer to be burned off and cause the circuit pattern to adhere to said surface of the substrate.

BRIEF DESCRIPTION OF THE DRAWINGS

FIG. 1 is a flow chart illustrating the method of this invention;

FIGS. 2 to 5 are fractionary sectional views illustrating each step in the method of this invention, wherein each component is exaggeratively shown for simplicity of explanation;

FIG. 6 is a fractionary enlarged plan view showing an example of printed circuit pattern;

FIG. 7 is a fractionary perspective view of an insulating substrate;

FIG. 8 is a sectional view showing a modification of the step as shown in FIG. 4;

FIG. 9 is a sectional view showing a modification of the step as shown in FIG. 5;

FIG. 10 is a fractionary enlarged plan view showing an example of printed circuit pattern different from that shown in FIG. 6;

FIGS. 11 (A) and 11 (B) are sectional and plan views respectively, for use in explanation of this invention;

FIGS. 12 (A) and 12 (B) are another sectional and plan views respectively, for use in explanation of this invention;

DESCRIPTION OF THE PREFERRED EMBODIMENTS

Figure 13:
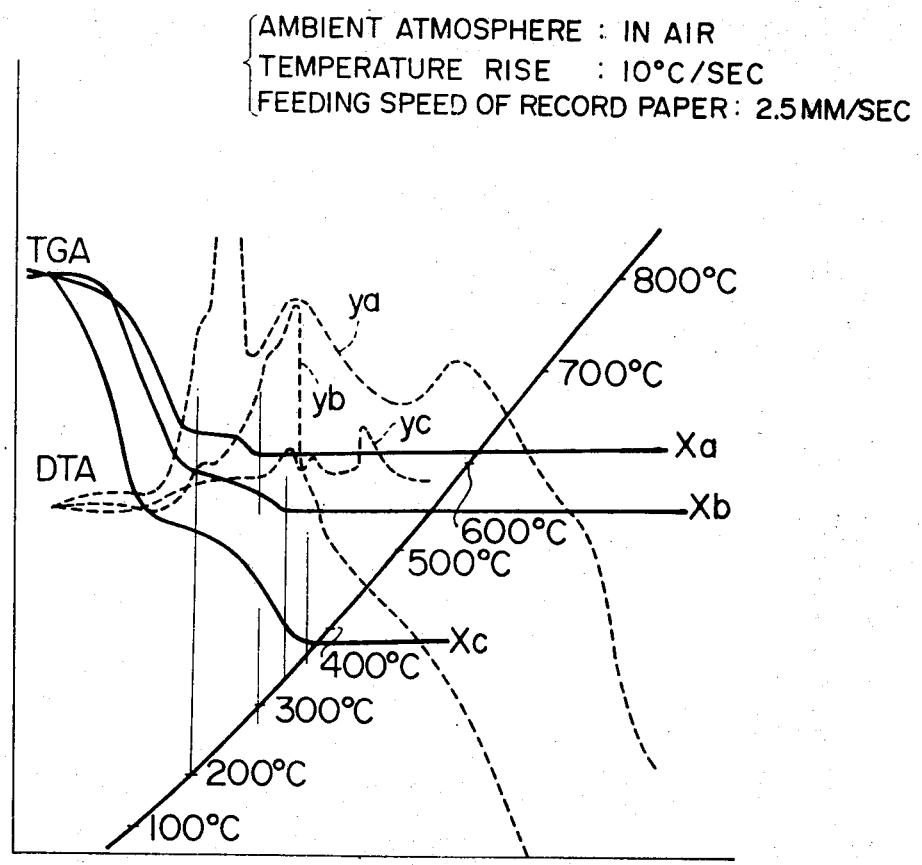
FIG. 13 illustrates thermobalance curves and differential thermobalance curves of the materials of the resistive elements and the electric conductors and the carrier layer of a methacrylic acid resin used in the method of this invention.

This invention will be described in detail in connection with embodiments as shown in the accompanying drawings. According to the method of this invention, a thermal printing head can be fabricated through the steps as shown in FIG. 1. In a step 1, a paper sheet is prepared. The paper sheet may be strong and may have water absorbability. One surface $1a$ (see FIG. 2) of the paper sheet is finished as a smoothened face. In an adhesive layer applying step A, an adhesive layer 2 (see FIG. 2) is applied over the smoothened surface $1a$ of the paper sheet by means of adhesives $2a$ such as adhesives prevailingly containing polyvinyl alcohol and dextrin, or other water soluble adhesives. Additionally, the adhesives $2a$ may be pressure-sensitive adhesives. Next, in a printing step B, a desired circuit pattern 3 consisting of a pattern of electric conductors 3A and a pattern of resistive elements 3B is printed on the upper surface 2 of said adhesive layer 2 by means of a material 3A' for the electric conductors and a material 3B' for the resistive elements. An example of the printed circuit pattern 3 is shown in FIG. 6. In the example of FIG. 6, a plurality of dot-like resistive elements 3B are arranged as a block. One or more of such blocks indicate a character, symbol or numeral. Alternatively, with a printing head for the purpose of printing only numerals, resistive elements may be formed as a group of segments capable of selectively indicating all of numerals, as shown in FIG. 10. Additionally, if desired, the circuit patterns 3A and 3B may be printed directly on the surface $1a$ of the paper sheet 1 without providing any adhesive layer. The material 3A' for the electric conductors may be an electric conductive paste consisting of an organic binder capable of being baked in a burning step F as will be described in detail hereinafter and glass frit and an electric conductive powder such as Pt, Ag, $RuO_2$, Rh, Pa or Pd mixed therewith. The material 3B' for the resistive elements may be a paste-like resistive paint consisting of an organic binder similar to that mentioned above and glass frit, the same electric conductive powder as mentioned above, silver oxide and palladium oxide mixed therewith. The material 3A' for the electric conductors is firstly printed in the form of a desired pattern. Secondly, the material 3B' for the resistive elements is printed in the form of a desired pattern. As mentioned above, according to this invention each circuit pattern is printed on the flat surface 1a of the paper sheet 1 to ensure that the circuit pattern may be more easily formed with a very high accuracy. Namely, since circuit patterns are printed on one plane according to this invention, they can be easily formed with a very high accuracy and at a very high speed, similarly to conventional printing, even if they are complicated and minute. Furthermore, since the flat surface of a paper sheet is utilized as a pattern forming face according to this invention, a sufficiently flat face for pattern forming can easily be provided. Therefore, according to this invention, it is possible to avoid formation of resistive elements having uneven surfaces which would be caused in the case of the resistive elements being printed directly on a surface of an insulating substrate such as a ceramic substrate. This will be described in detail in connection with FIGS. 11 (A) and 11 (B) and 12 (A) and 12 (B). If the surface 11a of a medium 11 on which a pattern is to be printed is sufficiently flat, as shown in FIGS. 11 (A) and 11 (B), the pattern 30 printed on the surface 11a can have very accurate dimensions such as thickness and width. On the contrary, if the surface 11a' of a medium 11' on which a pattern is to be printed has a recess 12 and projections 13, as shown in FIGS. 12 (A) and 12 (B), the pattern 30' printed on the surface 11a' will have unequal thicknesses $t_1$, $t_2$, $t_3$ and unequal widths $b_1$, $b_2$, $b_3$. Therefore, if the pattern 30' is a pattern of resistive elements, the resistive elements will have unequal resistances. Moveover, the pattern of the resistive elements will have a very low wear-resistibility due to unevenness of their thickness. According to this invention, such disadvantages can be eliminated.

In a carrier layer forming step C following the above-mentioned step B, the printed circuit pattern 3 is covered with a carrier layer 4. The carrier layer 4 may be formed of a methacrylic acid resin so that the carrier layer 4 can serve as a carrier accurately holding the printed circuit pattern 3 in place after the paper sheet 1 is peeled off therefrom in a paper sheet peeling off step D as will be described hereinafter, that the carrier layer 4 can be substantially transparent and that the carrier layer 4 can be burned off by heat baking at a temperature more than about 500°C in a burning step F as will be described hereinafter. For example, the carrier layer 4 may be formed by spraying a solution consisting of 50% by weight of methacrylate ester and 50% by weight of a thinner having a high boiling point from above the printed circuit pattern 3. The product as obtained through the step A to step C as mentioned above is shown in FIG. 2.

It is not always necessary to carry out steps D to G as described later, in continuity with the steps A to C. A number of the products as obtained through the steps A to C and shown in FIG. 2 may be prefabricated.

In the product as shown in FIG. 2, the printed circuit pattern 3 is sandwiched in between the paper sheet 1 and the carrier layer 4. In a paper sheet peeling off step D, the paper sheet 1 is peeled off. If a water soluble adhesives is used as the adhesives 2a in the adhesive layer applying step A, the paper sheet 1 used as a medium on which the circuit pattern is printed can be peeled off the lower surface of the printed circuit pattern 3 by soaking the whole or at least the paper sheet 1 of the product as shown in FIG. 2 in water to solve the water soluble adhesives. If a pressure-sensitive adhesive is used as the adhesives 2a, the paper sheet 1 can be forcedly and mechanically peeled off. The product which the paper sheet 1 has been peeled off is shown in FIG. 3. In FIG. 3, the printed circuit pattern 3 is held in place by the carrier layer 4 at the upper side thereof. Since the carrier layer 4 is made of a methacrylic acid resin which has an extremely high transparency and a high degree of mechanical strength per a unit of thickness in solid phase, as mentioned before, the printed circuit pattern 3 can be seen through the carrier layer 4 and can be kept in shape and held in place by the carrier layer 4. Furthermore, the product as shown in FIG. 3 is flexible.

In the next placing step E, the carrier layer 4 having the printed circuit pattern 3 carried on the lower surface thereof as shown in FIG. 3 is placed in a predetermined position on an insulating substrate 5 with the printed circuit pattern 3 being inside, as shown in FIG. 4. The shape of the insulating substrate 5 may be changed according to the entire structure of the thermal printing head. For example, the insulating substrate 5 may be made of an insulating material such as fosterite, steatite and alumina and may be shaped as a thermal printing head block as shown in FIG. 7. Since the printed circuit pattern 3 can be seen through the carrier layer 4, as mentioned above, the operator can position the printed circuit pattern 3 on the substrate 5 while seeing the printed circuit pattern 3 through the carrier layer 4. Therefore, the positioning can be easily and accurately effected, even if the end face 6 of the substrate 5 is a narrow area, as shown in FIG. 4. Furthermore, since the product consisting of the carrier layer 4 and the printed circuit pattern 3 is flexible, the printed circuit pattern 3 can be positioned in place simultaneously over two or more surfaces of the substrate 5 by bending the carrier layer 4 along the contour of the substrate 5, as shown in FIG. 4. While the printed circuit pattern 3 is intimately contacted with the peripheral surfaces of the substrate 5, if necessary, by applying a pressure thereto, the next burning step F is carried out. In the step F, for example, baking at about 500°C to 800°C for 60 to 150 minutes within a heating furnace is effected.

FIG. 13 illustrates the amounts of the thermal energies generated from and the changes in weight of the substances of the carrier layer (methacrylic acid resin) 4, the electric conductors and the resistive elements due to heating according to this invention. In FIG. 13, TGA indicates a thermobalance curve $x_a$ of the substance of the electric conductors, a thermobalance curve $x_b$ of the substance of the resistive elements and a thermobalance curve $x_c$ of the methacrylic acid resin, and DTA indicates a differential thermobalance curve $Y_a$ of the substance of the electric conductors, a differential thermobalance curve $Y_b$ of the substance of the resistive elements and a differential thermobalance curve $Y_c$ of the methacrylic acid resin.

As will be seen from FIG. 13, the baking as mentioned above causes the carrier layer 4 of methacrylic acid resin to be decomposed and evaporated and thus completely burned off without leaving carbonides and causes the material 3A' of the electric conductors and the material 3B' of the resistive elements to be firmly deposited on the surface of the substrate 5 as electric conductors 31A and resistive elements 31B respectively, as shown in FIG. 5. Although resistive elements are located on the end face 6 of the substrate 5 in FIGS. 4 and 5, resistive elements may be located on one side surface 7 of the substrate 5, as shown in FIGS. 8 and 9. The condition of each printed circuit pattern during each burning step in both cases of the carrier layer being made of a methacrylic acid resin according to this invention and the carrier layer being made of other material such as nitrocellulose which does not belong to this invention have been compared. When burning temperature reaches 300°C, the appearance of the printed circuit pattern becomes different from that of the printed circuit pattern in the other case as mentioned above. When burning temperature reaches about 500°C (the lower limit of burning temperature) at which the materials of the resistive elements and the electric conductors will be firmly deposited on the insulating substrate and will exhibit resistibity and conductivity respectively (the materials do not exhibit resistibity and conductivity before being baked), the resistive elements and conductive elements of the printed circuit pattern in the other case are so changed in shape or partially broken that they cannot serve as resistor and conductor respectively, while the appearance of the printed circuit pattern in this invention is not changed at all.

As in the example of this invention as mentioned above, use of a particular material for resistive elements or electric conductors may require burning of about 800°C. It has been found that the appearance of the printed circuit pattern in this invention is not changed even when burning temperature reaches 800°C, but the printed circuit pattern in the other case is so deformed that it cannot perform its desired function when burning temperature reaches 800°C.

Thus, according to the method of this invention, each step is easily carried out and a desired pattern of resistive elements and electric conductors can be formed with a high accuracy, thereby a thermal printing head of high quality can be efficiently fabricated.

Further modifications of the invention will become apparent to those of ordinary skill in the art upon reading the foregoing disclosure, but this disclosure is to be interpreted as illustrative and not as limitative, the scope of the invention being defined by the appended claim or claims.

We claim:

1. A method of fabricating a thermal printing head comprising the steps of printing a circuit pattern of resistive elements and electric conductors on one surface of a flat paper sheet, covering said circuit pattern and said one surface of said paper sheet with a carrier layer of a substantially transparent compound formed of a methacrylic acid resin capable of being burned off by heat baking at a temperature above about 500°C. without forming residual carbonides, peeling off said flat paper sheet, placing the remaining carrier layer carrying said circuit pattern over the surface of a preshaped insulating substrate with said circuit pattern being interposed between said carrier and said substrate and lying on said substrate, and thereafter baking said carrier layer substrate and circuit pattern at a temperature above about 500°C. to cause the carrier layer to be cleanly burned off and to cause the circuit pattern to adhere to said substrate.

2. A method according to claim 1, wherein said flat paper sheet has water absorbability and is sufficiently strong to be peeled off said circuit pattern and said carrier layer after being soaked in water.

3. A method according to claim 1, wherein an adhesive layer is applied over one surface of said paper sheet and then said circuit pattern is printed on the upper surface of said adhesive layer.

4. A method according to claim 3, wherein said adhesive prevailingly contains water soluble adhesives, and said paper sheet is peeled off from the printed circuit pattern by soaking at least the paper sheet in water to solve the adhesives.

5. A method according to claim 1, wherein said preshaped insulating substrate is of ceramic.

6. A method according to claim 5, wherein said insulating substrate is of a material selected from the group consisting of fosterite, steatite and alumina.

7. A method according to claim 1, wherein said carrier layer placed on the substrate is burned off at about 500°C to 800°C for about 60 to 150 minutes.

8. A method according to claim 7, wherein said carrier layer is burned off at about 800°C.

* * * * *